United States Patent [19]
Blumberg

[11] Patent Number: 5,148,171
[45] Date of Patent: Sep. 15, 1992

[54] MULTISLOPE CONTINUOUSLY INTEGRATING ANALOG TO DIGITAL CONVERTER

[75] Inventor: Leon Blumberg, Hockessin, Del.

[73] Assignee: Hewlett-Packard Company, Palo Alto, Calif.

[21] Appl. No.: 735,592

[22] Filed: Jul. 25, 1991

[51] Int. Cl.⁵ ............................................. H03M 1/50
[52] U.S. Cl. ..................................... 341/168; 341/166
[58] Field of Search ............... 341/168, 128, 129, 127, 341/167, 169, 170, 166, 155

[56]  References Cited

U.S. PATENT DOCUMENTS

| | | | |
|---|---|---|---|
| 3,566,265 | 2/1971 | Reid | 324/99 |
| 3,678,506 | 7/1972 | Wheable | 341/168 |
| 3,790,886 | 2/1974 | Kurtin et al. | 324/99 |
| 3,849,775 | 11/1974 | Buchanan et al. | 340/347 |
| 3,942,173 | 3/1976 | Wold | 340/347 |
| 4,063,236 | 12/1977 | Amemiya et al. | 340/347 |
| 4,074,257 | 2/1978 | Henry | 340/347 |
| 4,229,730 | 10/1980 | Huntington | 340/347 |
| 4,254,406 | 3/1981 | Meares | 341/168 |
| 4,357,600 | 11/1982 | Ressmeyer et al. | 340/347 |
| 4,357,600 | 11/1982 | Ressmeyer et al. | 341/168 |
| 4,857,933 | 8/1989 | Knight | 341/168 |

*Primary Examiner*—A. D. Pellinen
*Assistant Examiner*—B. K. Young
*Attorney, Agent, or Firm*—Richard F. Schuette

[57]  ABSTRACT

A multislope continuously integrating analog-to-digital converter for converting an analog input signal into a digital output signal where the converter employs an integrator for continuously integrating the input signal in relation to a series of reference voltages of increasing magnitude and a zero crossing detector to determine when the reference voltage has completely discharged the integrator. A counter or the like is employed for timing the duration of the discharge which corresponds to the digital equivalent of the analog input signal.

8 Claims, 5 Drawing Sheets

MULTISLOPE CONTINUOUSLY INTEGRATING ANALOG TO DIGITAL CONVERTER

BACKGROUND OF THE INVENTION

The disclosed invention relates generally to the digital measurement of unknown input signals such as voltage or current, and more particularly to an improved method for multislope continuously integrating Analog-to-Digital (A/D) conversion.

A conventional dual slope A/D converter is illustrated in FIG. 1 in which an input signal $V_{input}$ is only applied to the non-inverting input of the integrator for the run-up interval ($T_{up}$, as illustrated in FIG. 2). This input is then disconnected and a reference discharging voltage $E_{ref}$ is then applied to discharge the integrator during a run-down interval which ends when the integrator is totally discharged. The duration of the run-down interval is measured and is employed for calculating the value of $V_{input}$ which equals $T_{down} \times V_{ref}/T_{up}$.

The value of $T_{down}$ is typically measured by counting clock pulses contained in the run-down interval. For a given clock rate, the resolution of the A/D converter increases with an increase in the interval $T_{down}$. Therefore, resolution can be increased by decreasing the run-down voltage $V_{ref}$. However, an instrument user typically needs or wants a short measurement time so that large run-down intervals are impractical.

Multislope A/D converters are similar to dual slope A/D converters with the exception that reference voltages of varying magnitudes are employed for decreasing the measurement time without decreasing resolution. The output of a multislope A/D converter is illustrated on FIG. 3. By the end of the run-up period, the integrator's output is proportional to $T_{up}*V_{input}$. At a time $T_{up}$, the input signal is disconnected from the input of the integrator, and replaced with a reference voltage. This indicates the beginning of the run-down period of the conversion cycle. The run-down lasts for the time period $T_{down}$ which equals $T_{total}-T_{up}$, and consists of several sub-slopes resulting from different reference voltages. The first reference is applied to the integrator until the integrator output crosses the zero level. After crossing the zero level, another reference of a smaller magnitude and of the opposite direction relative to the first one is applied to the integrator's input. The process continues until the allocated number of the run-down sub-slopes has expired. The durations of all run-down sub-slopes are measured by the clock system, and added with weights and signs appropriate to the relative values and signs of each reference voltage. As a result, a resolution much higher than that available from a dual slope conversion (a single run-down slope) is achieved. Many different multislope conversion schemes are know, but their stability depends on the absence of an input signal during their run-down period. All such schemes utilize no larger than the $T_{up}/T_{total}$ fraction of the total signal energy, thus reducing the theoretical limit for their resolution.

Continuously integrating A/D converters is another class of A/D converters characterized by maintaining the connection between the input signal and the integrator throughout the run-up and run-down intervals. This type of converter does not lose any part of the input signal, and as a result, has a better potential for low noise, high resolution and wide dynamic range. Known multislope techniques which employ step-by-step reduction of the magnitude of the reference voltage become unstable if the input signal is not disconnected. In particular, if a signal is always connected to the integrator's input, the zero crossing of its output will not occur once the magnitude of a reference voltage is reduced below the magnitude of the input signal. This prevents a meaningful reduction in the reference voltage and enhancement of converter resolution.

Although continuously integrating A/D converters are potentially better than the conventional ones, conventional A/D converters outperform the former in many practical implementations. In particular, conventional A/D converters utilize multislope techniques while all known continuously integrating A/D converters utilize dual slope techniques. Until this invention, all known conventional multislope techniques were incompatible with continuous integration.

SUMMARY OF THE INVENTION

This invention provides for a new method and apparatus for continuously integrating multislope analog to digital conversion and employs a step-wise increasing reference voltage rather than a reference voltage reduction scheme. This technique does not rely on zero crossings of the integrator output for termination of intermediate run-down sub-slopes.

Unlike prior multislope A/D converters, the input signal always remains connected to the input of the integrator. The conversion process consists of a series of conversion cycles each $T_{total}$ long. The end of a given conversion cycle will also be the beginning of the following one.

In particular, the invention includes an integrator in which multiple reference voltages of increasing magnitude are applied to discharge the input signal. The integrator output corresponds to the difference between the input signal and the reference voltages. A zero crossing detector is employed for producing a zero integrator output signal when the integrator output is equal to zero such that the reference voltages can be sequentially applied to the integrator for predetermined time periods or until occurrence of the zero integrator output signal. A timing circuit is employed for timing the duration in which each reference voltage is applied and for applying a weighting factor, corresponding to the magnitude of the applied reference voltage, to the time for which the reference voltage was applied. A digital output signal is then generated which corresponds to the weighted value of the total time in which the reference voltages were applied.

A factor of four (4) increase in the magnitude of the reference voltages provides a reasonable tradeoff between minimizing the count time and converter resolution. However, it is certainly possible to increase the reference voltage to a lesser or a greater degree.

DESCRIPTION OF THE PREFERRED EMBODIMENT

Figure 1:
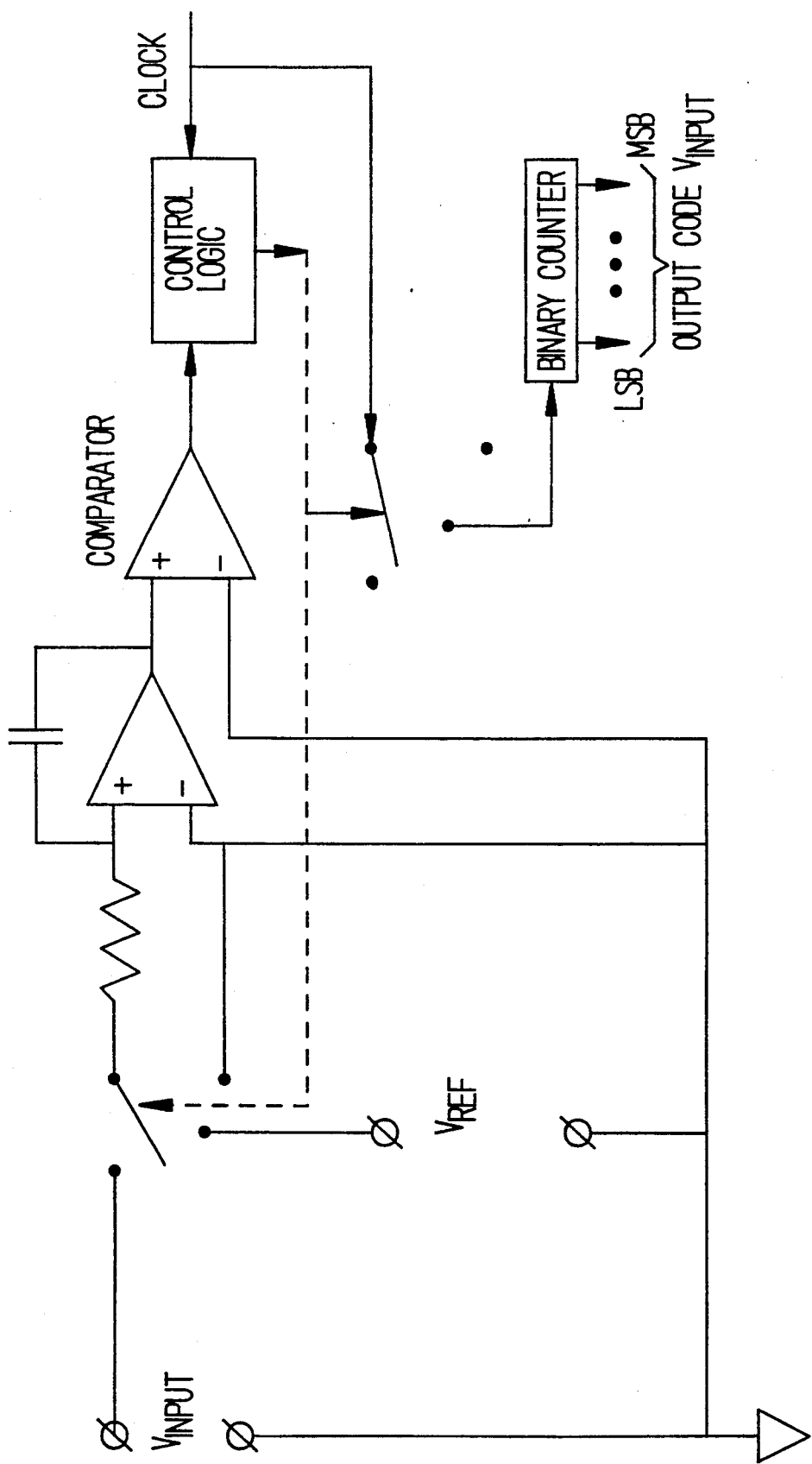
FIG. 1 is a schematic diagram of the prior art dual slope A/D converter.
Figure 2:
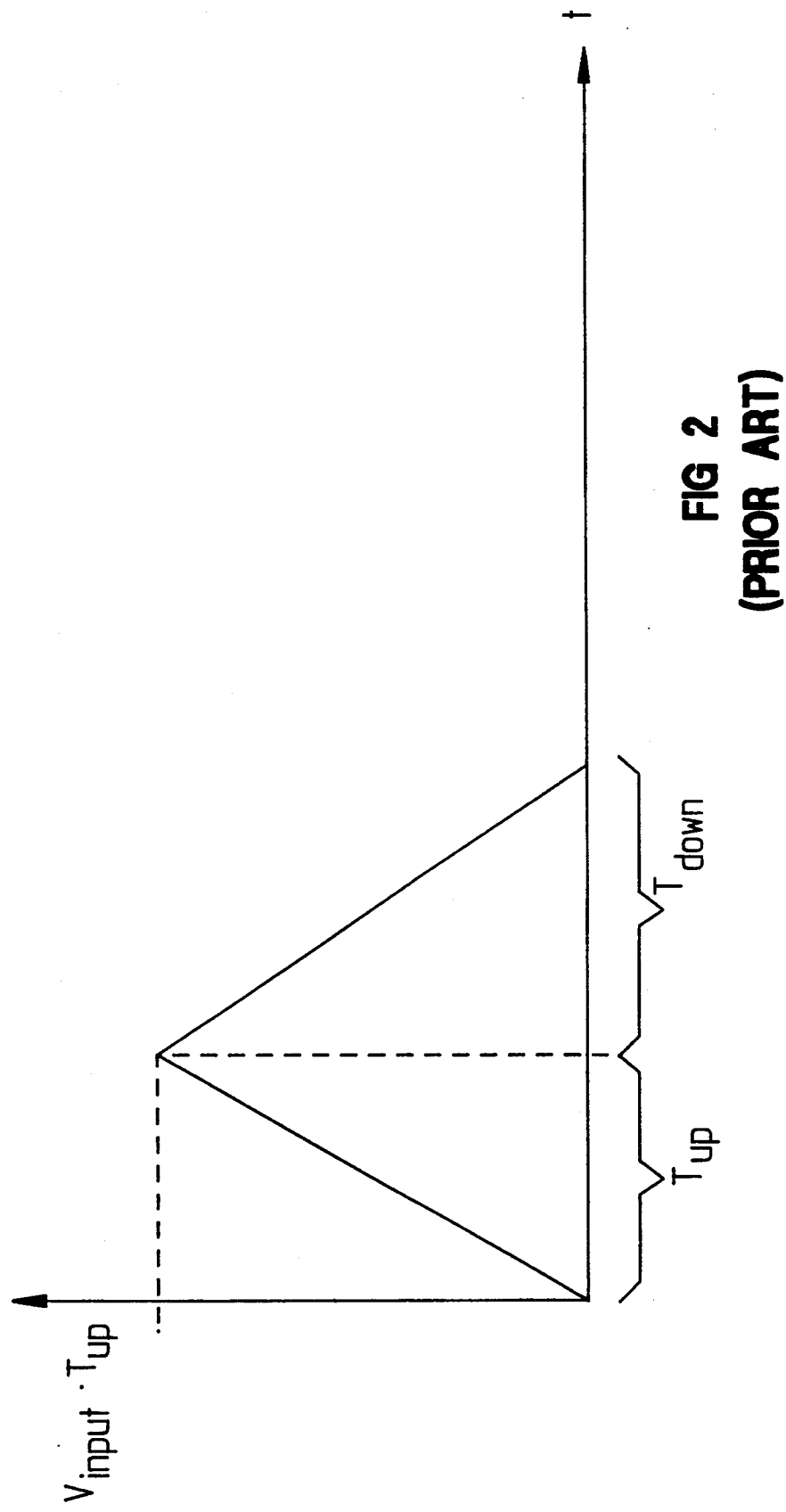
FIG. 2 is a diagram illustrating the integrator output of the dual slope A/D converter set forth in FIG. 1.
Figure 3:
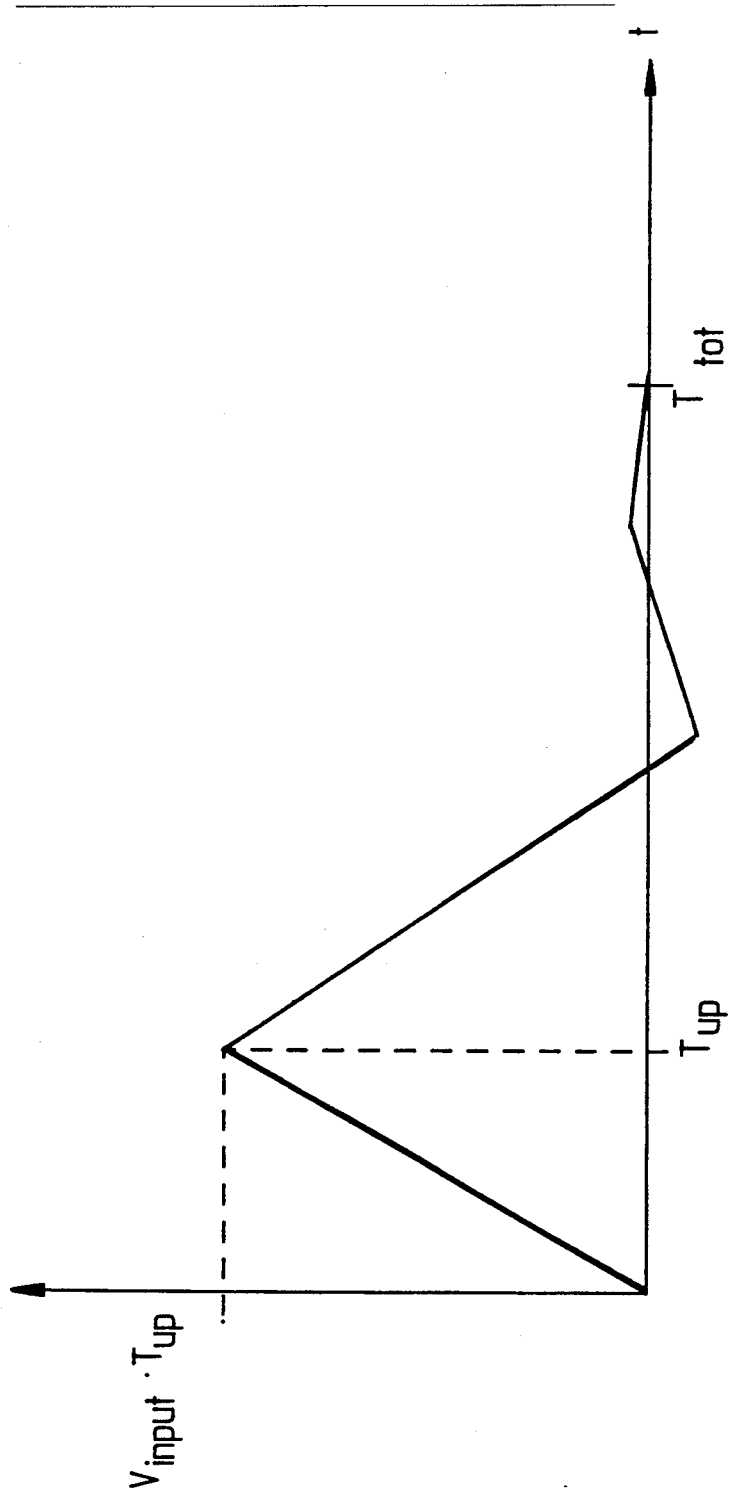
FIG. 3 is a diagram illustrating the integrator output of a multislope A/D converter.
Figure 4:
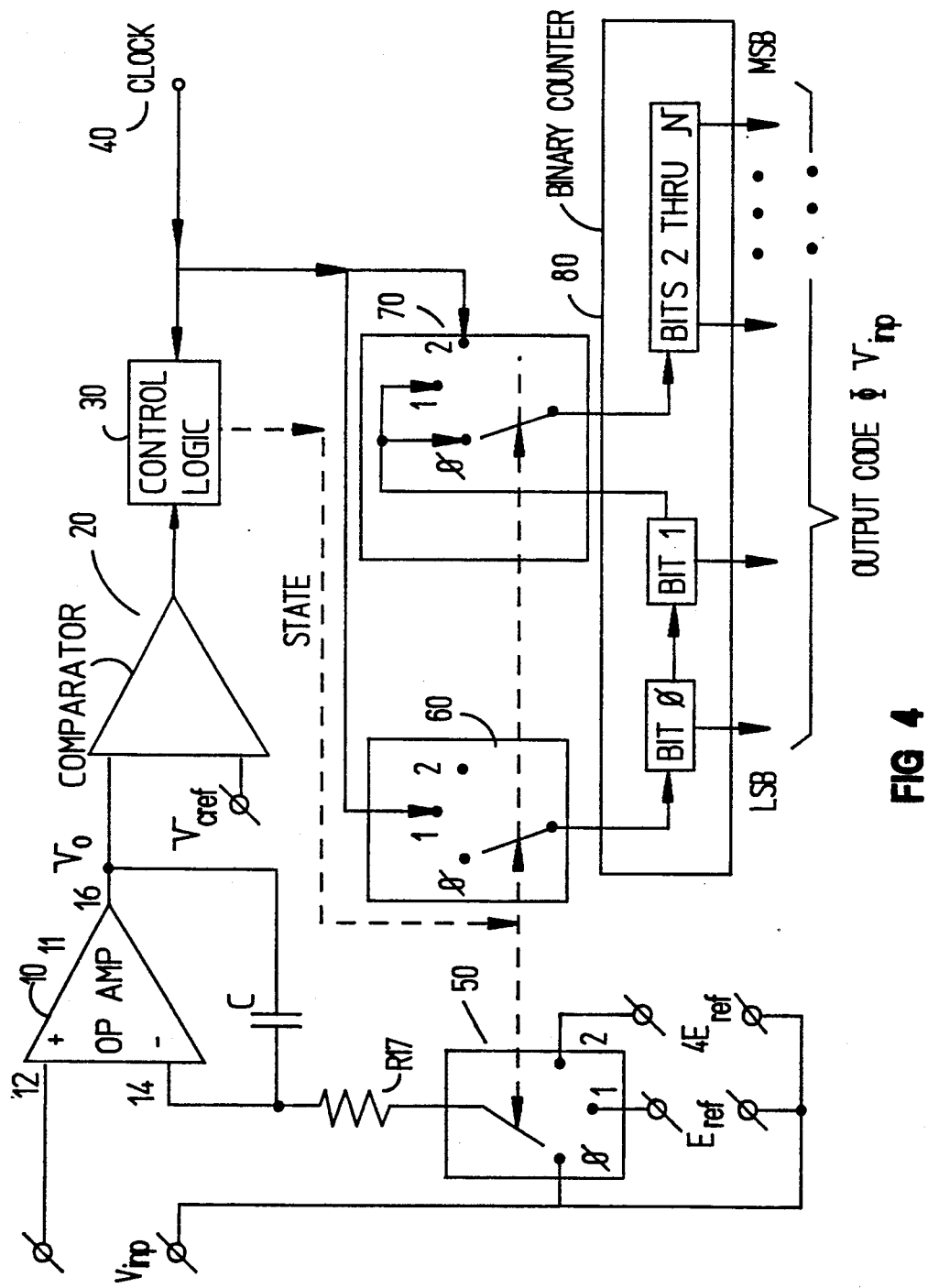
FIG. 4 is a schematic diagram of a continuously integrating multislope A/D converter in accordance with the preferred embodiment.

The disclosed invention presents a continuously integrating, multislope A/D conversion technique and an A/D converter for implementing the conversion technique. As illustrated in FIG. 4, the A/D converter includes an integrator 10 comprising an operational amplifier 11 having a non-inverting input 12 and an inverting input 14 and an output 16. The inverting input is coupled to the output 16 through a feedback capacitor 18 and to ground, $E_{ref}$ or $4E_{ref}$ through a resistor 19 and a three position switch 50. Control logic 30, coupled to the output of the comparator 20 and a clock 40 actuates the switch 50 such that the voltage $E_{ref}$ is coupled to the inverting input 14 through resistor 19. The switch 50 can be actuated further such that the voltage $4E_{ref}$ is applied to the input 14. The application of this voltage will ensure rapid discharge of the capacitor 18.

Figure 5A:
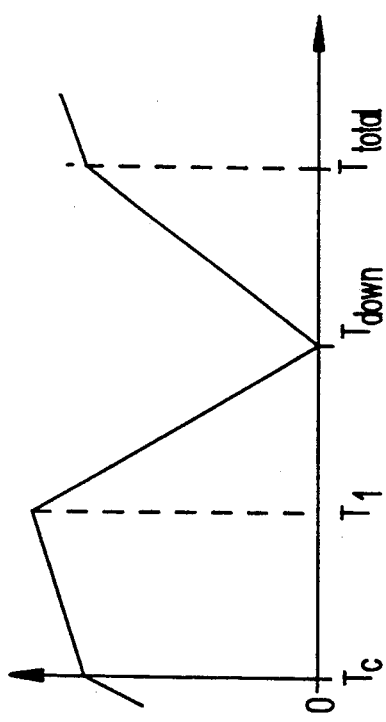
FIG. 5(a), 5(b) and 5(c) are diagrams illustrating the integrator output of a continuously integrating multislope A/D converter in accordance with the preferred embodiment.
Figure 5B:
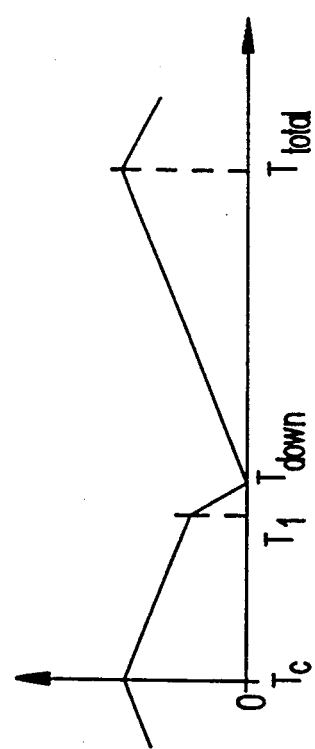
Figure 5C:
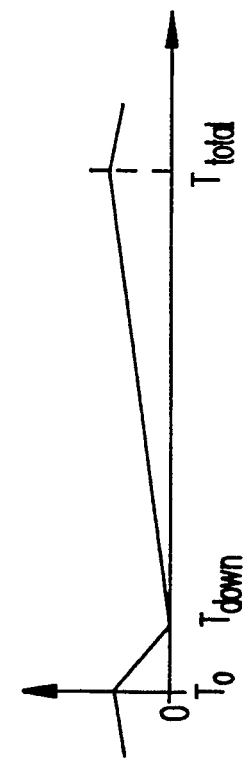

As set forth in FIG. 5 (a), FIG. 5(b) and FIG. 5(c) the conversion cycle starts at a time ($T_o$) at which time, the reference voltage $V_{ref}$ is connected to the inverting input 14 of the integrator 10. The integrator output 16 ($V_o$) is controlled by two opposing inputs. If the input signal is larger than the reference voltage, the output will initially go up, FIG. 5 (a). If input signal is smaller than the reference voltage the output will initially go down, FIG. 5 (b), FIG. 5 (c). This sub-cycle will last until a fixed time $T_1$, Fig. 5 (a), 5 (b), or until a zero-crossing event, FIG. 5 (c), whichever comes first. The latter occurs only for the smallest input signals and indicates the end of the run-down sub-cycle and the beginning of the run-up sub-cycle. For larger input signals zero-crossing will not take place before $T_1$. At $T_1$ the reference current increases to become large enough to reverse the slope to the downward direction. On FIG. 5 (a), 5 (b), the discharge lasts until the zero crossing at the time $T_{down}$, indicating the end or run-down sub-cycle and the beginning of the run-up. In all cases, the run-up begins by disconnecting the reference voltage from the integrator's input and lasts until the start of the next run-down sub-cycle. The duration of all run-down sub-slopes are measured by the clock system, and added with weights appropriate to the relative values of each reference voltage. As a result, a resolution much higher than that available from a dual slope continuously integrating conversion, which only has a single run-down slope. Since the signal is always connected to the integrator's input, its total energy is integrated, and resolution improvement could go much further than in a conventional (not continuously integrating) multislope conversion case.

It is well known that the input signal voltage can be quantified by counting the time it takes to discharge the capacitor with a known reference voltage. The comparator 20, has one input coupled to the output of integrating circuit 10 and another connected to ground, such that an output signal is generated which indicates when the capacitor 18 has been discharged. A two stage binary counter 80 is employed for timing the duration of the discharge. The first stage, or the first two least significant bits of binary counter 80, is coupled to the clock 40 through a second three position switch 60. The second stage of the counter 80, or the third through "N" significant bits, are coupled to the two least significant bits of the clock through the null position and the first position of a third three position switch 70, and directly to the clock 40 through position two of switch 70. Control logic 30, coupled to the output of the comparator 20 is employed for simultaneously actuating the three switches 50, 60 and 70.

An input signal of up to 1 Volt is constantly applied to the non-inverting input 12 of the operational amplifier 11. The invention attempts to determine the magnitude of this input signal at a rate of 2400 measurements per second (samples/sec). The second input 14 is sequentially coupled to ground, $E_{ref}$ and finally $4E_{ref}$. When coupled to ground (the run-up period), the capacitor 18 is charged with the rate proportional to the input signal by the integrating action of the operational amplifier. Unlike the prior art technique in which the input signal is disconnected from the non-inverting input at the end of run-up, the input signal is never disconnected from this input, and at the end of the run-up a relatively small discharge voltage of approximately 0.625 volts is first applied for a period of 100 microseconds, at which point the control logic 30 switches the three switches from position one to position two, thus increasing the discharge voltage by a factor of 4 to 2.5 volts and moving the second switch to position two (the null position) and the third switch to position two such that the clock is coupled directly to the third significant bit of the binary counter. Thus, the count rate is effectively multiplied by a factor of 4 at the same time as the discharge rate. This second voltage insures that the capacitor is completely discharged within another 220 microseconds. Upon an indication that the capacitor is completely discharged, the control logic actuates all three switches such that they are all switched back to position "0", whereupon, the capacitor begins to be recharged.

Assuming that the capacitor is completely discharged while coupled to the first discharge voltage, the invention provides for increased resolution as the duration of the run-down is longer than for prior art devices. For simplicity, only two run-down sub-slopes were illustrated in the block diagram of FIGS. 5(a)–5(c). The invention contemplates that many more run-down sub-slopes can be employed with a corresponding number of binary sub-counters. The invention is stable as the last run-down voltage is the largest, thus insuring complete discharge.

While the invention has described and illustrated with reference to specific embodiments, those skilled in the art will recognize that modifications and variations may be made without departing from the principles of the invention as described herein above and set forth in the following claims.

What is claimed is:

1. A multislope continuously integrating analog-to-digital converter for converting an analog input signal into a digital output signal, comprising:

reference voltage generating means for sequentially generating a plurality of reference voltages of increasing magnitude; and integrating means having a first input coupled to said generating means and a second input coupled to said analog input signal, said integrating means generating an output corresponding to the difference between said input signal and said sequentially generated reference voltages; and zero crossing detector means for producing a zero integrator output signal when said integrator output equals zero, wherein said reference voltages are sequentially applied to said input circuit for predetermined time periods until the occurrence of said zero integrator output signal; and timing means for generating a plurality of count signals corresponding to the duration in which each of said reference voltages are applied to said input circuit, wherein, a weighting factor, corresponding to the magnitude of said applied reference voltage, is employed for weighting the magnitude of the count signal, and wherein, said digital output signal corresponds to the weighted value of said count signal.

2. The apparatus as claimed in claim 1, wherein said reference voltage generating means first provides a reference voltage of $E_{ref}$ for a predetermined time period and then provides a second reference voltage of $4E_{ref}$ until the occurrence of a zero crossing signal.

3. The apparatus of claim 1, wherein said integrating means further comprises an operational amplifier having a non-inverting input and an inverting input and an output with a feedback capacitor coupling said output to said inverting input, and further comprises switching means to selectively switch said inverting input to either ground, $E_{ref}$ or $4E_{ref}$, and wherein a charge will be formed on the capacitor with the rate of growth proportional to the difference between the signal on the inverting and non-inverting inputs.

4. The apparatus of claim 3, wherein, the capacitor is charged when said inverting input is coupled to ground, charged or discharged depending on the relative magnitude of $E_{ref}$ and the input signal, when said inverting input is coupled to $E_{ref}$ and wherein said capacitor is discharged when said inverting input is coupled to the $4E_{ref}$ signal.

5. The apparatus of claim 1, wherein said zero crossing detector means further comprises comparator means having one input coupled to said integrating means and a second input coupled to ground, wherein, said zero integrator output signal is generated when said capacitor is completely discharged.

6. The apparatus of claim 1, wherein said timing means further comprises a clock having an output coupled to a multi-stage binary counter through a multi-stage switch in which the first stage of said switch couples the clock output to the least significant bits of said counter and each succeeding stage is coupled to increasing significant bits of said counter.

7. A method for employing a multislope A/D converter, which includes an integrator having both an inverting and a non-inverting input and a charging capacitor, to convert on a continuously integrating basis an analog input signal into a digital output signal, comprising the method steps of:, inputting said analog input signal into said non-inverting input, wherein, said capacitor is charged in proportion to the value of said input signals; and inputting a series of reference signals of increasing magnitude into said inverting input, wherein, said capacitor is discharged in proportion to the value of said reference signal; and generating a zero integrator output signal when said capacitor is completely discharged; and counting the time between the start of the input cycle and the generation of the zero integrator output cycle; and weighting the total time in accordance to the magnitude and duration of each inputted reference signal, wherein, said digital output signal corresponds to said weighted total time.

8. The method in accordance to claim 7, wherein, the step of inputting a series of reference signals further comprises the steps of; applying a first reference signal of $E_{ref}$ for between 50 and 150 microseconds and then a second reference signal of $4E_{ref}$ is applied to completely discharge the capacitor within 250 microseconds.

* * * * *